(12) United States Patent
Wojewnik et al.

(10) Patent No.: US 6,640,434 B1
(45) Date of Patent: Nov. 4, 2003

(54) METHOD OF FORMING AN ELECTRICAL CIRCUIT ON A SUBSTRATE

(75) Inventors: Albert Wojewnik, Royal Oak, MI (US); James D. Dowd, Farmington Hills, MI (US)

(73) Assignee: Lear Corporation, Southfield, MI (US)

( * ) Notice: Subject to any disclaimer, the term of this patent is extended or adjusted under 35 U.S.C. 154(b) by 160 days.

(21) Appl. No.: 09/821,697

(22) Filed: Mar. 29, 2001

Related U.S. Application Data

(60) Provisional application No. 60/196,188, filed on Apr. 11, 2000.

(51) Int. Cl.[7] .................................................. H05K 3/10
(52) U.S. Cl. ............................... 29/846; 29/825; 29/850
(58) Field of Search .......................... 29/846, 825, 830, 29/850

(56) References Cited

U.S. PATENT DOCUMENTS

| 3,813,519 A | * | 5/1974  | Jochim et al. |
|---|---|---|---|
| 4,031,268 A |   | 6/1977  | Fairbairn |
| 4,263,341 A |   | 4/1981  | Martyniak |
| 4,424,408 A |   | 1/1984  | Elarde |
| 4,618,504 A |   | 10/1986 | Bosna et al. |
| 4,711,026 A | * | 12/1987 | Swiggett et al. |
| 4,714,623 A |   | 12/1987 | Riccio et al. |
| 4,775,439 A |   | 10/1988 | Seeger, Jr. et al. |
| 4,800,648 A |   | 1/1989  | Nakayama et al. |
| 4,940,623 A |   | 7/1990  | Bosna et al. |
| 5,390,412 A | * | 2/1995  | Gregoire |
| 5,446,961 A | * | 9/1995  | Levite et al. |
| 5,743,010 A |   | 4/1998  | Zaguskin et al. |
| 5,891,527 A |   | 4/1999  | Turek et al. |
| 5,891,528 A |   | 4/1999  | Turek et al. |
| 5,950,305 A |   | 9/1999  | Roberts |
| 6,106,303 A |   | 8/2000  | Wojewnik |
| 6,180,886 B1 |  | 1/2001  | Krane et al. |

FOREIGN PATENT DOCUMENTS

WO        WO 99/50099        10/1999

* cited by examiner

*Primary Examiner*—Carl J. Arbes
(74) *Attorney, Agent, or Firm*—Bill C. Panagos; MacMillan, Sobanski & Todd, LLC

(57) ABSTRACT

A method of forming an electrical circuit on a surface of a substrate includes providing a substrate having a surface with at least one groove formed therein, the groove having a bottom textured surface, and applying an electrically conductive material onto the bottom textured surface of the groove.

27 Claims, 5 Drawing Sheets

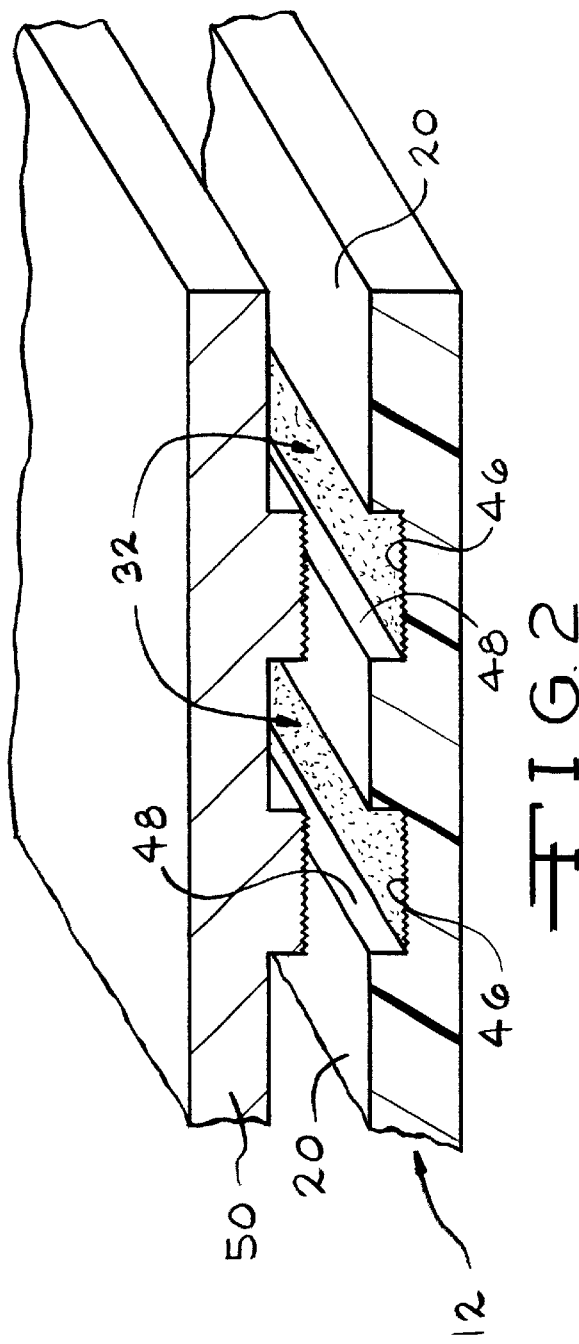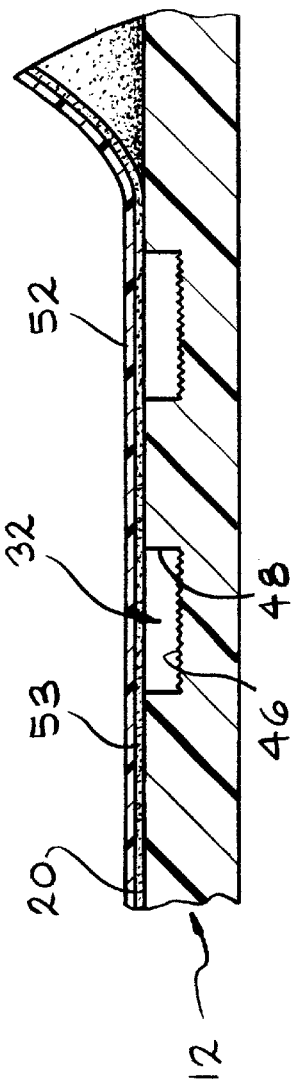

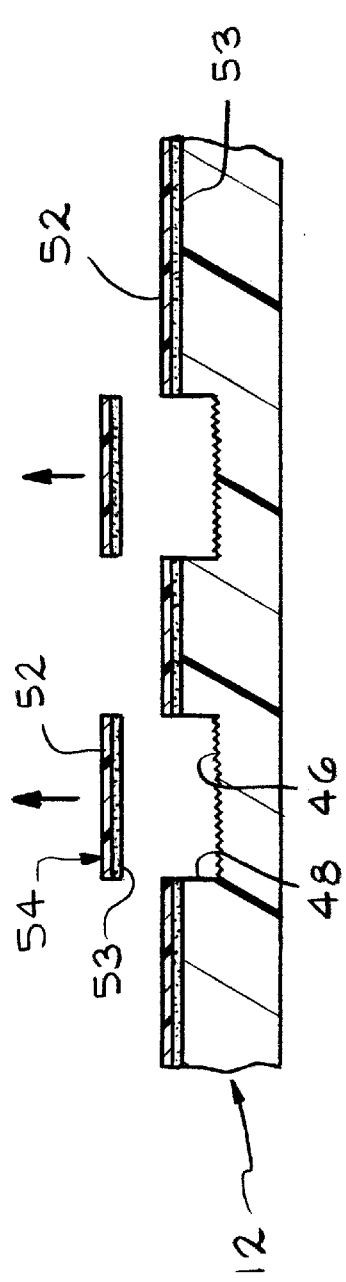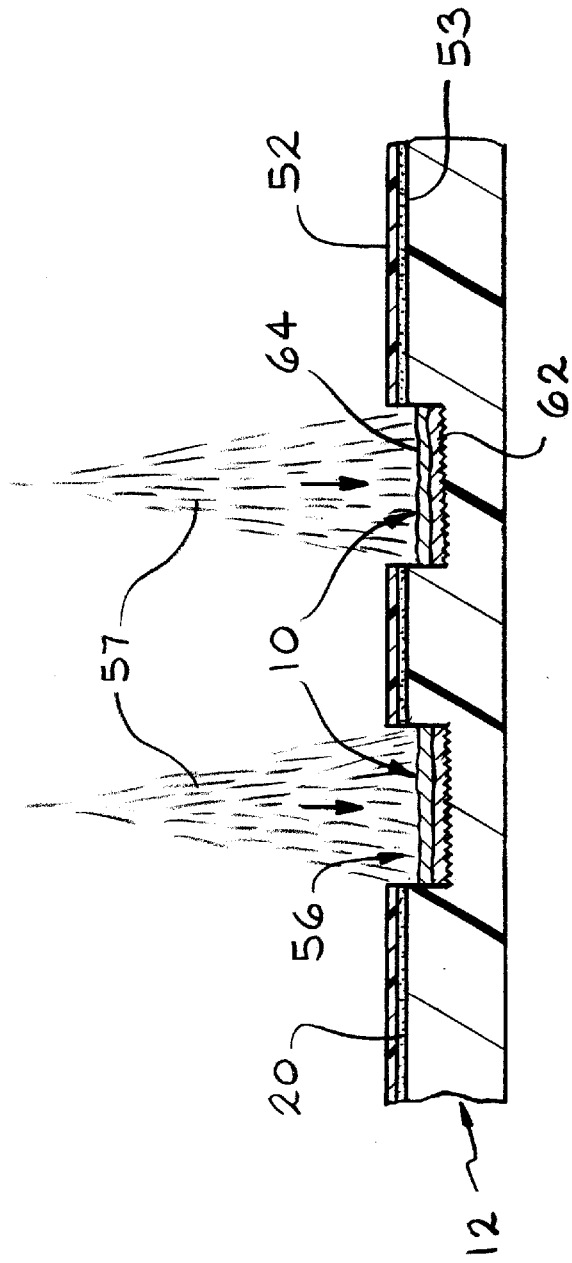

METHOD OF FORMING AN ELECTRICAL CIRCUIT ON A SUBSTRATE

RELATED APPLICATIONS

This application claims the benefit of U.S. provisional application Ser. No. 60/196,188, filed Apr. 11, 2000.

TECHNICAL FIELD

This invention relates to a vehicle trim panel assembly having an electrical circuit integrally molded into grooves. The subject invention also relates to the method of fabricating the trim panel with the electrical circuit.

BACKGROUND OF THE INVENTION

Vehicles typically have a number of trim panels mounted to different interior surfaces to present a pleasing appearance. One common type of trim panel is a door trim panel mounted to the interior surface of a door assembly. Typically, vehicle door assemblies include spaced apart inner and outer panels defining a cavity for mounting a window, window regulator, speaker, and other electrical devices. These devices are installed inside the door cavity through a plurality of access openings provided in the door inner panel.

The door trim panel conceals this interior surface of the door. The door trim panel is conventionally formed of a rigid panel, such as molded plastic or pressed hardboard, covered with a flexible decorative trim material such as cloth, vinyl, leather and/or carpeting. The door trim panel creates a pleasing appearance to the occupant, and is attached to the door by suitable fasteners.

The door trim panel also often supports a number of electrical components. These components include lights, window controls, rear view mirror controls, seat adjustment controls, and speakers. Each of these electrical components requires an individual wiring connector and power supply lead wires. The power supply lead wires for all the electrical components are typically bundled together to create what is commonly called a wiring harness. The wiring harness is often affixed to the trim panel or to the door to eliminate movement of the wires during operating conditions. As can be appreciated, the mounting and wiring of these electrical components is labor intensive and requires a number of connectors and other electrical parts.

Solutions to this problem have been contemplated by the prior art. Specifically, the prior art has proposed the power supply lead wires be mounted, molded, etched, printed, or otherwise affixed to a separate rigid board. The rigid board is in turn mounted in some fashion to either the trim panel or the door or both. Hence, in these proposals, the door assembly includes the door itself, a rigid board, and then the trim panel. In another solution proposed by the prior art, the interior surface of the trim panel includes at least one groove interconnecting one electrical connector to another electrical connector. A binding agent and an electrically conductive material are integrally deposited and adhered to the groove to define an electrical circuit.

These proposals, however, likewise have a number of deficiencies. The solution of incorporating the circuits into a separate board still requires a significant amount of manual labor to mount the wires to the board, mount the connectors to the board, and then mount the board itself to either the trim panel or the door. Further, additional connectors must be mounted on the board to electrically connect the connectors from the door to the connectors on the trim panel. The solution of a trim panel with an integrally molded electrical circuit requires a binding agent such as liquid polyurethane to be applied within the groove. This solution requires specialized equipment and additional labor to apply the binding agent.

Accordingly, it can be seen that it would be advantageous if there could be developed a method of forming an electrical circuit on a surface of a substrate wherein the method is easier and more economical than prior art methods.

It would also be advantageous if there could be developed a method of forming an electrical circuit within a groove formed on a surface of a substrate wherein the binding agent is eliminated.

Further, it would be advantageous if there could be developed a method of forming an electrical circuit within a groove formed on a surface of a substrate wherein the bottom surface of the groove is configured to facilitate adherence of an electrically conductive material.

SUMMARY OF THE INVENTION

The above objects as well as other objects not specifically enumerated are achieved by a method of forming an electrical circuit on a surface of a substrate. The method includes providing a substrate having a surface with at least one groove formed therein, the groove having a bottom textured surface; and applying an electrically conductive material onto the bottom textured surface of the groove.

In one embodiment of the invention, the bottom textured surface of the grooves have an irregular, non-smooth surface with a random grainy pattern. A thin layer of zinc and copper are then applied to the textured surface of the groove.

Preferably, the groove is integrally formed into the surface of the substrate during the manufacture of the substrate, and the bottom textured surface has a roughness such as sandpaper having a roughness within the range of from about 16-grit to about 50-grit sandpaper. The layer of zinc and copper preferably include at least one layer of zinc within the range of from about 0.02 millimeters to about 0.10 millimeters thick, and at least one layer of copper within the range of from about 0.10 millimeters to about 0.50 millimeters thick.

Various objects and advantages of this invention will become apparent to those skilled in the art from the following detailed description of the preferred embodiment, when read in light of the accompanying drawings.

BRIEF DESCRIPTION OF THE DRAWINGS

FIG. 2 is a perspective view of a portion of trim panel with grooves having textured bottom surfaces, illustrating the method of fabrication according to the invention.

FIG. 3 is a cross-sectional elevational view of the trim panel of FIG. 2, showing a layer of film or mask on the trim panel.

FIG. 4 is a cross-sectional elevational view of the trim panel showing the removal of a portion the layer of film or mask.

FIG. 5 is a cross-sectional elevational view of the trim panel, illustrating the application of a liquid metallic spray.

DETAILED DESCRIPTION OF THE INVENTION

Figure 1:
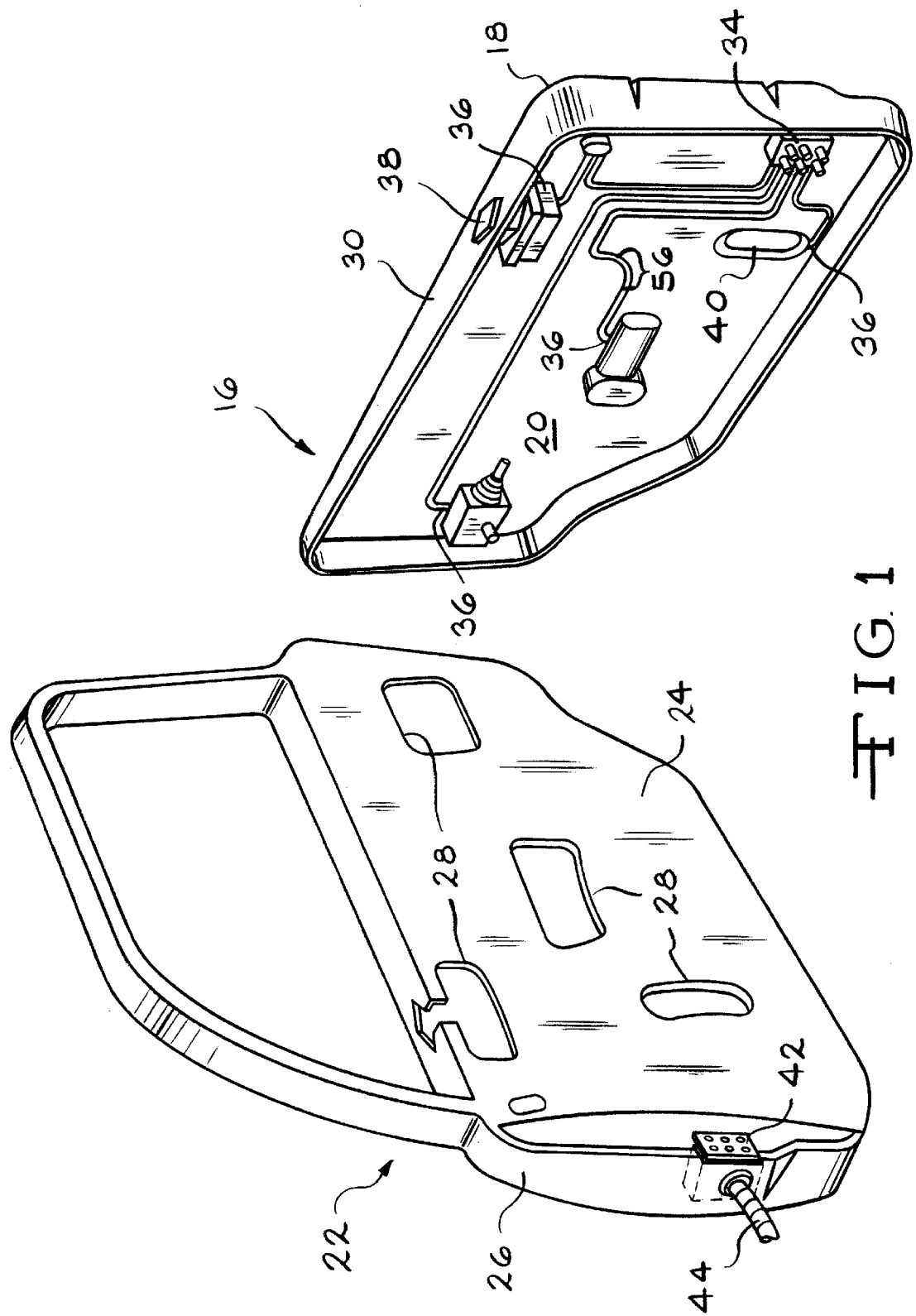
FIG. 1 is a perspective view of a trim panel assembly in spaced relationship to a vehicle door assembly.

A vehicle trim panel assembly is generally shown at 14 in FIG. 1. The trim panel assembly 14 comprises the trim panel 16 of an electrically non-conductive material having an exterior surface 18 and a relatively smooth interior surface 20. The trim panel 16 of the preferred embodiment is an automotive door trim panel 16 which mounts to a vehicle door assembly, generally shown at 22. The trim panel 16 of the subject invention may be any type of trim panel associated with a vehicle. Other types of trim panels include trunk panels, quarter panels, rear package trays, headliners, instrument panels, garnish moldings, and console panels, among others.

The vehicle door assembly 22 includes spaced apart inner 24 and outer 26 metal panels defining a cavity (not numbered) for mounting a window, window regulator, speakers, and other electrical devices (not shown). A plurality of access openings 28 are provided in the inner panel 24 to allow access into the cavity of the door assembly 22. The door trim panel 16 is utilized to conceal this interior surface 24 of the vehicle door 22.

The door trim panel 16 is preferably formed of a molded plastic material such as polypropylene. As appreciated by those skilled in the art, the trim panel 16 may be fabricated of wood fibers, polyurethane, solid molded vinyl, expanded polyurethane foam, any combination thereof, or any other suitable rigid, electrically non-conductive material. The exterior surface 18 of the trim panel 16 includes a decorative surface. Specifically, the trim panel 16 may be covered with a flexible decorative trim material 30 such as cloth, vinyl, leather, and/or carpeting. The trim panel 16 is attached to the vehicle door 22 by suitable fasteners (not shown) as is well known in the art.

The interior surface 20 of the trim panel 16 includes at least one groove 32, as shown in FIGS. 2 to 4. In the preferred embodiment, a first electrical connector 34 is placed at one end of each groove 32. A second electrical connector 36 is placed at the other end of the same groove 32. These electrical connectors 34, 36 can be of any suitable design or configuration without deviating from the scope of the invention. The interior surface 20 of the trim panel 16 also supports a number of electrical components. These components can include window controls (not shown), rear view mirror controls 38, seat adjustment controls (not shown), speakers 40, and the like. Each of these electrical components 38, 40 typically has an associated individual second electrical connector 36.

As shown in FIG. 1, the vehicle door assembly 22 also includes at least one electrical connector 42 that corresponds with the electrical connector 34 of the trim panel 16. A vehicle wire harness 44 is coupled to the electrical connector 42 of the door assembly 22. Hence, the electrical connector 42 of the door assembly 22 is the main power supply source for all the components within the vehicle door 22 and the trim panel 16. Specifically, the first electrical connector 34 of the trim panel 16 is electrically connected to the electrical connector 42 of the door assembly 22 and the second electrical connector 36 of the trim panel 16 is electrically connected to one of the electrically operated components 38, 40.

As shown in FIG. 2, the grooves 32 include a textured bottom surface 46 and spaced apart side walls 48 extending upwardly from the textured bottom 46. Preferably, the grooves 32 and corresponding textured surfaces 46 are integrally formed into the surface 20 during molding or pressing of the trim panel 16. However, a die or tool 50 having a corresponding profile thereon can also form the grooves 32 and/or the corresponding textured surfaces 46. Preferably, the grooves 32 have a depth in the range of about 0.10 mm to about 0.70 mm. The bottom of each groove 32 has a textured surface 46 which is preferably different from the interior surface 20 of the substrate 12. The textured surface 46 has an irregular or regular, non-smooth surface, such as a random grainy pattern, a grooved pattern, or a dimpled pattern. Preferably, the textured surface 46 has a roughness such as sandpaper having a roughness within the range of about 16-grit to about 50-grit. Alternatively, the textured surface can have a roughness average, $R_a$, within the range of from about 50 microns to about 150 microns. In the preferred embodiment, the grooves 32 have a substantially rectangular cross-sectional configuration. However, it is to be understood that the grooves 32 can be formed by any suitable process, and can be of any shape, depth, width, or cross-sectional shape without deviating from the scope of the invention.

After the grooves 32 are formed, the textured surfaces 46 of the grooves 32 are preferably cleaned by washing with a solvent. Preferably, the solvent is a petroleum based solvent.

As illustrated in FIG. 3, a layer of masking film 52 is preferably applied on the surface 20 of the substrate 12. Preferably, the masking film 52 is a film such as a thin sheet of a polymer material, having an adhesion resistant upper surface and an adhesive layer 53 on the lower surface. The adhesive layer 53 adheres to the surface 20 of the substrate 12. The masking film 52 can also be an uncured liquid material (not shown) which is applied to the surface 20 by a spraying or dipping process (not shown) and thereafter cured to form a relatively solid material. Alternatively, an uncured liquid material could be applied to a tool having a profile corresponding to the surface 20. The tool is then pressed against the surface 20 to apply the masking film 52, which can be later cured.

Portions 54 of the masking film 52 located above or within the grooves 32 are then removed, as illustrated in FIG. 4. There are several methods for removal of portions 54 of the film 52. For example, the portions 54 can be cut from the masking film 52 by a cutting tool having blades, or by a laser, and then removed. Additionally, the outline of the outer edges of the grooves 32 can be pre-scored in the masking film 52. After removing the portions 54, the remaining surface 20 of the substrate 12 is still covered by the masking film 52, and the grooves 32 are exposed. Alternatively, the portions 54 of the masking film 52 corresponding to the grooves 32 may be removed prior to applying the masking film 52 to the surface 20, thereby leaving the grooves 32 exposed.

According to the invention, an electrically conductive material is applied to the textured surfaces 46 of the grooves 32. The electrically conductive material is preferably a metallic material 10 comprising multiple layers of zinc and copper. Other types and combinations of metallic material may be utilized so long as the material has sufficient conductivity characteristics and will become fixed within the grooves 32. For example, a single layer of metallic material can be used. As shown in FIG. 5, the metallic material 10 is disposed along the bottom textured surfaces 46 of the grooves 32 and between the sides 48 thereof to form the traces 56 of an electrical circuit. The metallic material 10 is applied to the textured surfaces 46 by any suitable method, such as by spraying from a nozzle assembly. For example, the metallic material 10 can be applied by spraying molten metal particles 57 directed at the substrate 12, such as by a thermal spraying process or by plasma spraying. The adhesive resistant upper surface of the masking film 52 is purposely made to be a smooth and glossy surface unacceptable for adhesion of thermal sprayed or plasma sprayed metal so that the metallic material 10 will substantially adhere only to the non-masked textured surfaces 46 of the grooves 32. Optionally, the masking film 52 is then removed from the surface 20 as illustrated in FIG. 6.

Figure 7:
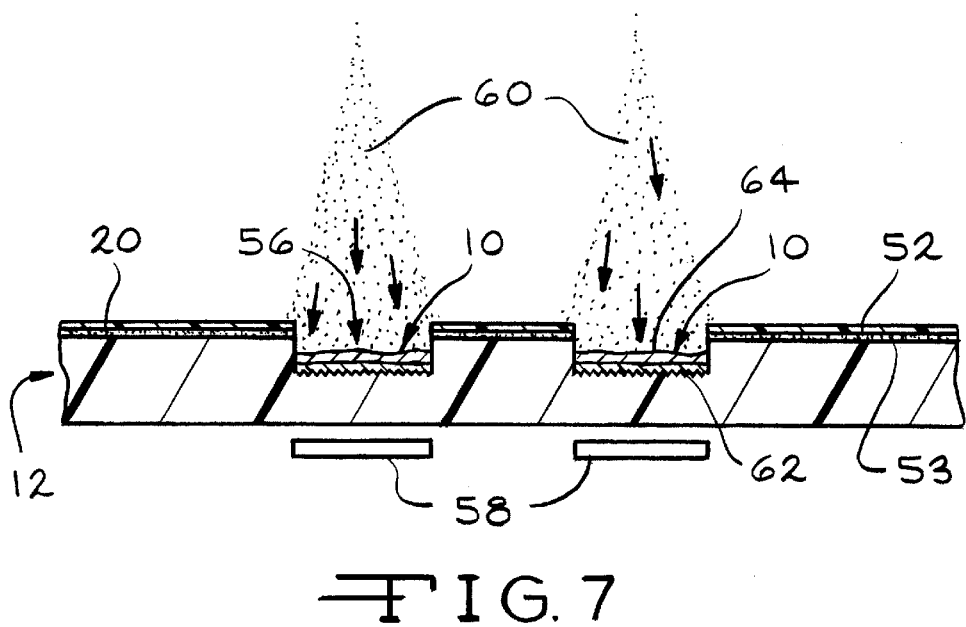
FIG. 7 is a cross-sectional elevational view of the trim panel, illustrating the application of a metallic powder spray.

In an alternative method of applying the metallic layer, the metallic material 10 can be applied by high velocity kinetic deposit techniques, wherein metallic powder is directed towards the substrate by hot air, as shown in FIG. 7. Electrodes 58 can be positioned on the opposite side of the substrate 12 adjacent the bottom of the grooves 32 and electrically charged via a high voltage source (not shown). A metallic powder spray 60 is then oppositely charged and caused to be attracted to the bottom textured surface 46 by electrostatic means. Preferably, the metallic material 10 is sprayed on at a very high velocity and the masking film 52 is made of a material such that the metallic particles deflect or bounce off the masking film 52 attached to the surface 20 of the substrate 12. The over-spray can be collected and reprocessed for later spraying. In this case, the masking film 52 can be left on the surface 20 of the substrate 12 since minimal metallic powder is caused to adhere to the masking film 52. If desired, the masking film 52 can be removed from the surface 20 after the metallic material 10 is deposited in the grooves 32.

Figure 6:
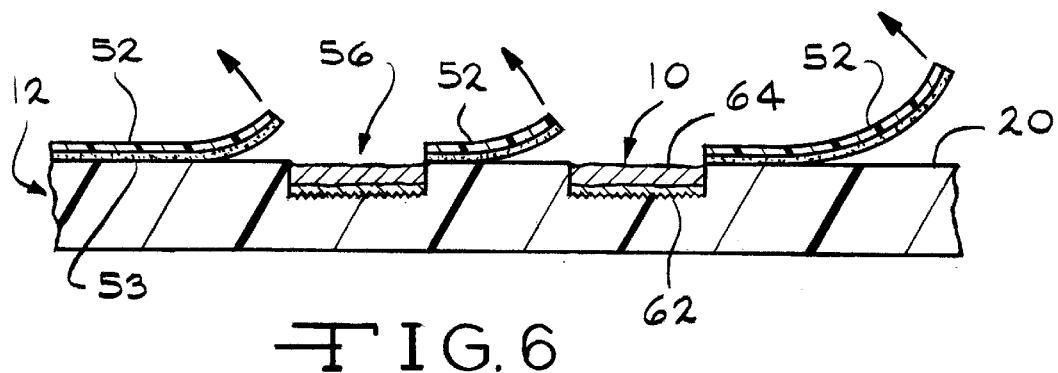
FIG. 6 is a cross-sectional elevational view of the trim panel showing the removal of the remaining portion of the layer of film or mask.

Preferably, the metallic material 10 comprises a thin layer of zinc 62 having a thickness within the range of from about 0.02 mm to about 0.10 mm, applied to the textured surface 46, as shown in FIGS. 5 to 7. One or more layers of copper 64 having a thickness within the range of from about 0.10 mm to about 0.50 mm are then applied onto the thin layer of zinc 62. The layer of zinc 62 forms a bonding layer between the textured surface 46 and the layers of copper 64. The total thickness of zinc 62 and copper 64 is within the range of from about 0.12 mm to about 0.60 mm.

The textured surfaces 46 of the grooves 32 provide a desirable surface, which retains the metallic material 10 during application of the material 10 by any of the aforementioned methods, and after the material 10 has cooled. While the smooth and glossy surface of the masking film 52 is typically unacceptable for adhesion of thermal sprayed, plasma sprayed, or kinetic deposited metals, the quality of the textured surface 46 is such that it is enabled to absorb and/or retain the metal particles.

Figure 8:
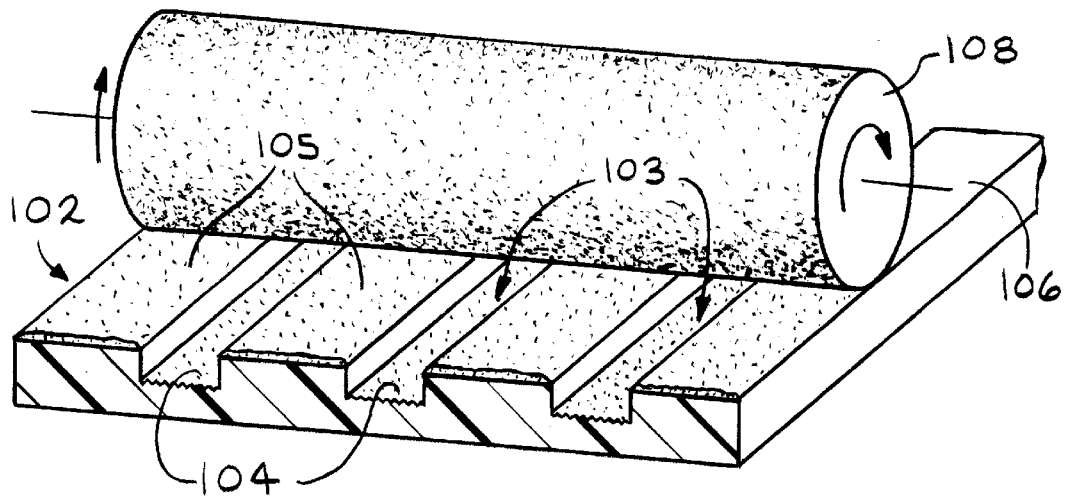
FIG. 8 is a perspective view of the trim panel showing an alternative method of fabrication.
Figure 9:
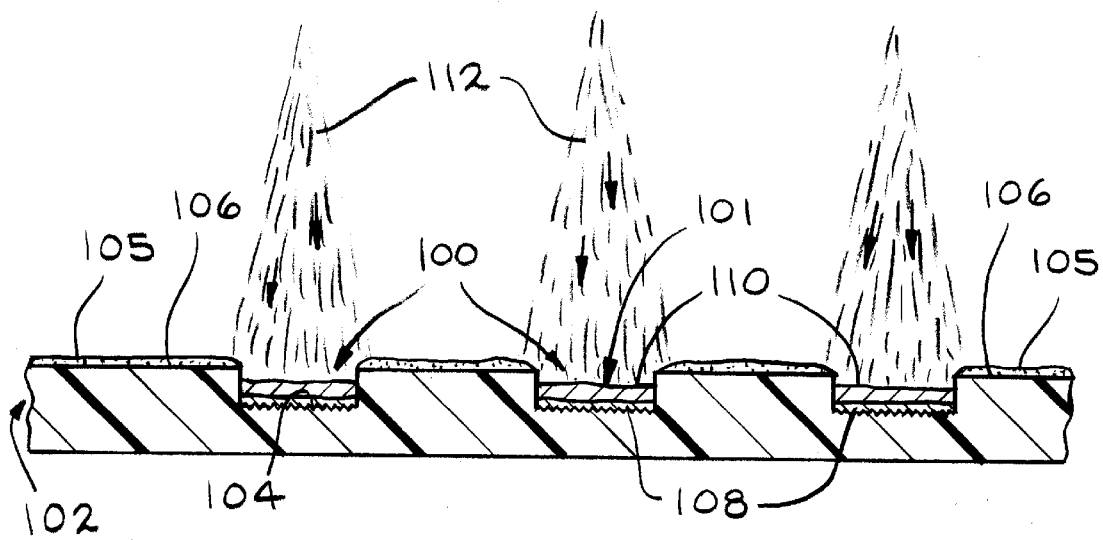
FIG. 9 is a cross-sectional elevational view of the trim panel illustrated in FIG. 8, showing the application of a liquid metallic spray.

There is shown in FIGS. 8 and 9 a second method of forming electrical circuits 100 on a rigid substrate 102, in accordance with the present invention. The substrate 102 is similar to the substrate 12, and includes grooves 103 having bottom textured surfaces 104 similar to textured surfaces 46. A masking layer 105 is applied on an upper surface 106 of the substrate 102 by a screening or printing process, such as by means of a roller 108. The roller 108 is coated with a liquid adhesive. The roller is rolled across the surface 106, and a masking layer 105 is applied to the surface 106. This process is ideal for substrates having a relatively flat surface. This method has the advantage that the step of removing the portions 54 of the masking film 52 above the grooves 32, as shown in FIG. 4, is eliminated. As shown in FIG. 9, a metallic material 101 is applied to the bottom textured surfaces 104. As described in the preferred embodiment, the metallic material 101 preferably comprises a thin layer of zinc 108 forming a bonding layer, and one or more layers of copper 110 applied to the layer of zinc 108. The metallic material 101 can be applied by spraying molten metal particles 112, or any other manner as described above.

Although the invention is described in the context of providing an electrical circuit for a vehicle trim panel, it is to be understood that the method of the invention can be used to form electrical circuits on other substrate configurations such as appliances, for example refrigerator or dish washer panels.

The principle and mode of operation of this invention have been described in its preferred embodiments. However, it should be noted that this invention may be practiced otherwise than as specifically illustrated and described without departing from its scope.

What is claimed is:

1. A method of forming an electrical circuit on a surface of a substrate, the method comprising:

providing a substrate having a surface with at least one groove formed therein, the groove having a bottom textured surface; and applying an electrically conductive material onto the bottom textured surface of the groove.

2. The method according to claim 1, including placing a masking film against the surface of the substrate.

3. The method according to claim 2, wherein the masking film has at least one opening corresponding with the at least one groove, and wherein said placing step leaves at least a portion of the at least one groove exposed.

4. The method according to claim 1 including forming the groove and the bottom textured surface subsequent to providing the substrate, the groove and the bottom textured surface being formed with a die tool.

5. The method according to claim 1, wherein said forming step includes forming the groove to a depth within the range of from about 0.10 millimeters to about 0.70 millimeters.

6. The method according to claim 1, wherein the bottom textured surface is an irregular, non-smooth surface having a random grainy pattern.

7. The method according to claim 1, wherein the bottom textured surface has a roughness within the range of from about 16-grit to about 50-grit sandpaper.

8. The method according to claim 1, wherein the bottom textured surface has a roughness average, $R_a$, within the range of from about 50 microns to about 150 microns.

9. The method according to claim 1, wherein subsequent to forming the groove having a bottom textured surface, the textured surface is cleaned with a solvent.

10. The method according to claim 2, wherein subsequent to placing the masking film against the surface of the substrate, portions of the masking film are removed to expose the bottom textured surface of the groove.

11. The method according to claim 10, wherein the substrate is a vehicle trim panel having an interior surface, and an exterior surface with a decorative appearance, the interior surface having a plurality of grooves formed on thereon, and wherein the grooves and the bottom textured surfaces are formed with a die tool subsequent to said step of providing a substrate.

12. The method according to claim 1, wherein said step of applying an electrically conductive material onto the bottom textured surface of the groove comprises:

applying at least one layer of zinc having a thickness within the range of from about 0.02 millimeters to about 0.10 millimeters onto the bottom textured surface of the groove; and applying at least one layer of copper having a thickness within the range of from about 0.10 millimeters to about 0.50 millimeters onto the layer of zinc.

13. A substrate manufactured in accordance with the method of claim 1.

14. The substrate according to claim 13, wherein said substrate is non-electrically conductive and has a surface and a groove formed in said surface, said groove defining a bottom textured surface, and wherein a metallic material is applied to said bottom textured surface.

15. The substrate according to claim 14, wherein said groove has a depth within the range of from about 0.10 millimeters to about 0.70 millimeters.

16. The substrate according to claim 14, wherein said bottom textured surface is an irregular, non-smooth surface having a random grainy pattern.

17. The substrate according to claim 14, wherein said bottom textured surface has a roughness within the rang of from about 16-grit to about 50-grit sandpaper.

18. The substrate according to claim 14, wherein said metallic material comprises:

at least one layer of zinc having a thickness within the range of from about 0.02 millimeters to about 0.10 millimeters applied to the bottom textured surface of said groove; and at least one layer of copper having a thickness within the range of from about 0.10 millimeters to about 0.50 millimeters applied to said layer of zinc.

19. A method of forming an electrical circuit on a surface of a substrate, the method comprising:

providing a substrate having a surface;

forming at least one groove within the surface of the substrate, the groove having a bottom textured surface;

placing a masking film against the surface of the substrate;

subsequently removing portions of the masking film to expose the grooves;

applying at least one layer of a first metallic material onto the bottom textured surface of the groove; and applying at least one layer of a second metallic material onto the layer of zinc.

20. The method according to claim 19, wherein the at least one layer of the first metallic material is at least one layer of zinc from about 0.02 millimeters to about 0.10 millimeters thick, and the at least one layer of the second metallic material is at least one layer of copper from about 0.10 millimeters to about 0.50 millimeters thick.

21. The method according to claim 19, wherein the substrate is a vehicle trim panel having an interior surface, and an exterior surface with a decorative appearance, the at least one groove being formed on the interior surface of the trim panel.

22. The method according to claim 19 including forming the groove and the bottom textured surface with a die tool.

23. The method according to claim 19, wherein said forming step includes forming the groove to a depth within the range of from about 0.10 millimeters to about 0.70 millimeters.

24. The method according to claim 19, wherein the bottom textured surface is an irregular, non-smooth surface having a random grainy pattern.

25. The method according to claim 19, wherein the bottom textured surface has a roughness within the range of from about 16-grit to about 50-grit sandpaper.

26. The method according to claim 19, wherein the bottom textured surface has a roughness average, $R_a$, within the range of from about 50 microns to about 150 microns.

27. A method of forming a vehicle trim panel with an electrical circuit comprising:

providing a trim panel having an interior surface, and an exterior surface with a decorative appearance;

forming a plurality of grooves having bottom textured surfaces within the interior surface of the trim panel, each of the grooves defining an electrical circuit trace;

placing a masking film against the interior surface of the trim panel;

subsequently removing portions of the masking film to expose the grooves; and applying a metallic material onto the bottom textured surface of the grooves.

* * * * *